United States Patent

Pettigrew et al.

[11] Patent Number: 4,657,780
[45] Date of Patent: Apr. 14, 1987

[54] MANUFACTURE OF DIFFRACTION GRATINGS

[75] Inventors: Robert M. Pettigrew, Foxton; Robert J. Longman, Coton, both of England

[73] Assignee: Dr. Johannes Heidenhain GmbH, Traunreut, Fed. Rep. of Germany

[21] Appl. No.: 759,699

[22] Filed: Jul. 29, 1985

[30] Foreign Application Priority Data

Aug. 8, 1984 [GB] United Kingdom ............ 8420182

[51] Int. Cl.⁴ ............................................. B05D 3/06
[52] U.S. Cl. ................................. 427/54.1; 427/162
[58] Field of Search ............ 427/54.1, 162; 430/321; 350/162.17

[56] References Cited

U.S. PATENT DOCUMENTS 818,966  4/1906  Ives ........................... 350/162.17
4,124,672 11/1978 Jarsen ........................... 427/162

Primary Examiner—John H. Newsome
Attorney, Agent, or Firm—Lee, Smith & Zickert

[57] ABSTRACT

In a method of manufacturing a diffraction grating, the grating-bearing surface of a master grating is coated with a release agent, and a rigid substrate has a layer of ultravoilet sensitive liquid resin applied thereto before bringing the master grating and the substrate together to trap a film of the liquid resin therebetween, whereafter the liquid resin is cured by exposure to ultraviolet light through the master grating and the master grating and resin-profiled substrate are separated prior to completion of the diffraction grating by deposition of a thin metal film on the resin-profiled surface of the substrate.

13 Claims, 6 Drawing Figures

MANUFACTURE OF DIFFRACTION GRATINGS

FIELD OF THE INVENTION

This invention relates to a method of manufacture of a diffraction grating for application in metrology. More especially, for example, the diffraction grating produced by method of this invention finds application in the displacement measuring apparatus and method of the Applicant's European Patent Specification No. 0132978.

OBJECT OF THE INVENTION

It is an object of the invention to enable reproduction of replica gratings from a master grating, in particular a master grating of glass or analogous light-transmitting material wherein the grating is formed either by a pattern in relief on one surface of the glass master or by a pattern of deposited metal, more especially chromium, on the one surface of the glass master.

THE INVENTION

According to the invention, a method of manufacturing a diffraction grating comprises:
 (1) coating the grating-bearing surface of a light transmitting master grating with a release agent;
 (2) applying ultraviolet sensitive liquid resin to a rigid substrate and bringing the master grating and the substrate together to trap a film of liquid resin between the substrate and the grating-bearing surface;
 (3) curing the resin film by exposure thereof to ultraviolet light transmitted through the master grating;
 (4) separating the master grating and the resin-profiled substrate at the grating-bearing surface of the master grating coated with release agent;
 (5) depositing a thin metal film on to the resin-profiled surface of the substrate, as by sputtering or evaporation.

A preferred method includes the following further steps:
 (6) coating the deposited metal film on the substrate with liquid ultra violet-sensitive resin;
 (7) covering the resin coating with a light-transmitting strip or plate to smooth the surface of said resin coating and exposing the resin coating to ultraviolet light through the light-transmitting strip or plate in order to cure the resin;
 (8) separating the light-transmitting strip or plate from the replica diffraction grating constituted by the treated substrate.

The substrate itself is preferably of metal, for example steel, which is preferably surface roughened before application of the liquid resin in step (2). This roughening may be effected by fine grinding or by sand blasting. The deposited metal film can be aluminium, but other metal depositions may be preferred for improved environmental performance.

The entire process is desirably carried out at normal ambient temperature, whereby stress levels in the cured resin are minimised and highly accurate replica gratings are achieved.

The invention also extends to diffraction gratings produced by the above described method.

DESCRIPTION OF METHOD

Figure 1A:
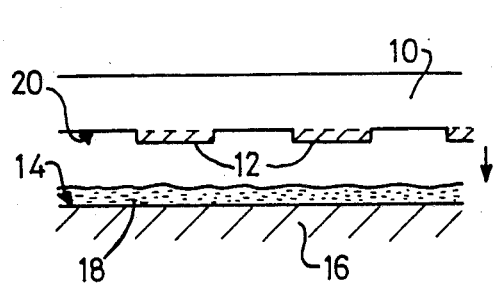
FIGS. 1A to 1E show steps of a preferred grating manufacturing method in accordance with the invention.

In FIG. 1A, a master diffraction grating 10 is of glass with a grating pattern 12 formed by chromium deposited on the glass. The invention enables the production of replica gratings from the master 10. For this purpose, the first step in the method is to roughen the surface 14 of a steel substrate 16, as by fine grinding or sand blasting, and applying thereto, as by a doctor blade, a layer of liquid polymer resin 18 of the type curable by exposure to ultra violet light.

Figure 1B:
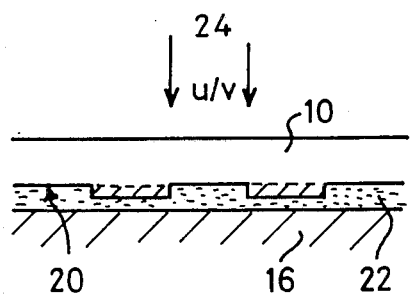

The grating-bearing surface 20 of the master 10 is coated with a release agent and the master and the substrate 16 are then brought together, as shown in FIG. 1B, to trap a film 22 of resin between the substrate and the grating-bearing surface. The resin 22 is then cured by exposure to ultra violet light transmitted through the master 10, as indicated at 24. This step may be accomplished by passing the master/substrate assembly beneath a high intensity ultra violet source. The chromium pattern 12 on the master 10 does not prevent the liquid resin underneath said pattern from being cured, since scattering of light takes place emanating from the light transmitting regions or gaps between the lines of the chromium pattern.

Figure 1C:
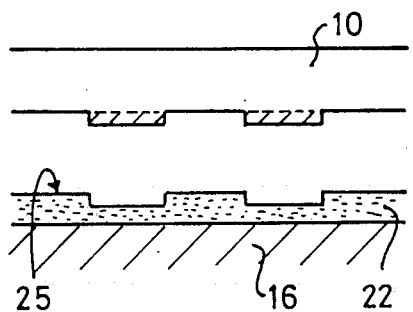

At the next step, FIG. 1C, the master 10 coated with release agent is separated from the profiled, cured resin film 22 on the substrate 16. It is found that the replica has an accurately controlled profile 25 substantially independent of process variables. For minimising stress in the cured resin, all the above and following stages of the method are desirably carried out at normal ambient temperature. This ensures dimensional stability.

Figure 1D:
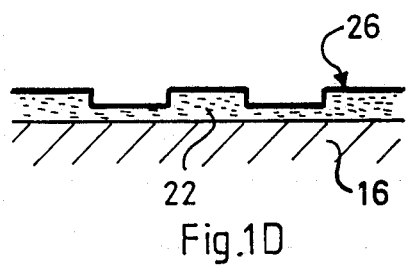

At the next step shown in FIG. 1D, a thin metal film 26 is deposited on the profiled resin film 22, as by sputtering or evaporation. Aluminium is one suitable metal to form the deposition.

Figure 1E:
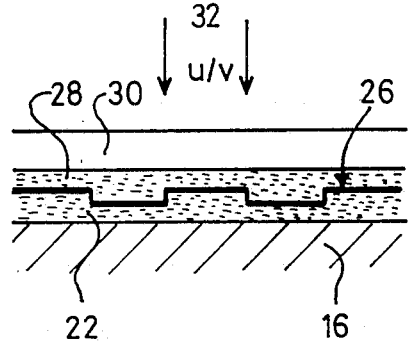

Referring to FIG. 1E, this metal film 26 is in turn covered by a layer of liquid ultra violet-sensitive polymer resin 28, smoothed by covering with a glass strip or plate 30 through which the resin layer 28 is then cured by exposure to ultra violet light as indicated at 32. Finally, the replica grating is separated from the glass cover 30.

Figure 2:
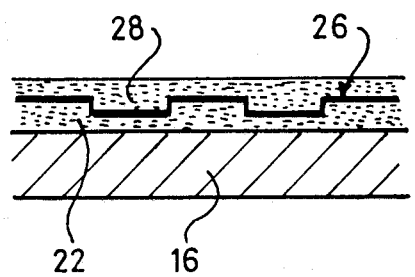
FIG. 2 shows a final grating.

The final form of the replica grating is shown in FIG. 2. Its flatness is determined by the glass master, as any irregularities in the metal are levelled by the polymer resin.

The above-described method is equally applicable to replication of an all glass master diffraction grating. The method has the advantages of avoiding degradation in quality which can arise when replication is carried out via an intermediate former, of being simple and inexpensive, and of placing no limit on the length of the replica gratings within the dimensions of the master. Ultra violet sensitive polymer resins afford extremely good replication capability with minimum risk of underfilling the form to be copied. In practice, replica gratings have been faithfully reproduced with depths in the range from 0.1 to 0.26 microns.

We claim:
1. A method of manufacturing a diffraction grating comprising the steps of:

(1) coating with a release agent the surface of a light-transmitting master grating which bears a non-light transmitting grating pattern;

(2) applying ultraviolet sensitive liquid resin to an opaque, rigid substrate and bringing the master grating and the substrate together to trap a film of liquid resin between the substrate and the grating-bearing surface;

(3) curing the resin film by exposure thereof to ultraviolet light transmitted through the master grating, which ultraviolet light passes through the light transmitting regions of said surface thereof and is scattered from said regions throughout the resin film including the regions thereof beneath the non-light transmitting grating pattern;

(4) separating the master grating and resin-profiled substrate at the grating-bearing surface of the master grating coated with release agent; and (5) depositing a thin metal film on to the resin-profiled surface of the substrate.

2. A method according to claim 1, wherein the thin metal film is deposited by sputtering.

3. A method according to claim 1 wherein the thin metal film is deposited by evaporation.

4. A method according to claim 1, including the following further steps:

(6) coating the deposited metal film on the substrate with liquid ultraviolet-sensitive resin;

(7) covering the resin coating with a light-transmitting strip or plate to smooth the surface of said resin coating and exposing the resin coating to ultraviolet light through the light-transmitting strip or plate in order to cure the resin;

(8) separating the light-transmitting strip or plate from the replica diffraction grating constituted by the treated substrate.

5. A method according to claim 1, wherein the substrate is a metal substrate.

6. A method according to claim 5, wherein the substrate is a steel substrate.

7. A method according to claim 5, wherein the substrate is surface roughened prior to application of the liquid resin in step (2).

8. A method according to claim 7, wherein surface roughening is effected by fine grinding.

9. A method according to claim 7, wherein surface roughening is effected by sand blasting.

10. A method according to claim 1, wherein the deposited metal film is an aluminium film.

11. A method according to claim 1, wherein all steps are carried out at normal ambient temperatures.

12. A method according to claim 4, wherein all further steps are carried out at normal ambient temperature.

13. A diffraction grating when manufactured by the method according to claim 1.

* * * * *